(12) United States Patent
van Zeijl

(10) Patent No.: US 7,167,062 B2
(45) Date of Patent: Jan. 23, 2007

(54) OSCILLATOR CIRCUIT AND OSCILLATOR BIASING METHOD

(75) Inventor: Paulus Thomas van Zeijl, Veldhoven (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/509,830

(22) PCT Filed: Apr. 5, 2002

(86) PCT No.: PCT/NL02/00221

§ 371 (c)(1),
(2), (4) Date: May 6, 2005

(87) PCT Pub. No.: WO03/088473

PCT Pub. Date: Oct. 23, 2003

(65) Prior Publication Data

US 2005/0225407 A1   Oct. 13, 2005

(51) Int. Cl.
*H03B 5/00* (2006.01)

(52) U.S. Cl. .................. 331/185; 331/74; 331/167; 331/116 FE; 331/116 R

(58) Field of Classification Search .............. 331/74, 331/185, 167, 158, 116 FE, 116 R
See application file for complete search history.

(56) References Cited

U.S. PATENT DOCUMENTS

| 3,979,693 A | 9/1976 | Saari | 331/61 |
| 4,590,513 A | 5/1986 | Craft | 348/708 |
| 4,710,730 A | 12/1987 | Doyle, III | 331/116 FE |
| 6,107,894 A | 8/2000 | Sander | 331/143 |
| 6,137,374 A * | 10/2000 | Merrill | 331/158 |
| 6,163,228 A * | 12/2000 | Pope | 331/117 R |

* cited by examiner

*Primary Examiner*—Arnold Kinkead
(74) *Attorney, Agent, or Firm*—Nixon & Vanderhye, P.C.

(57) ABSTRACT

An oscillator circuit with an oscillator device. The oscillator device has a oscillator bias contact (Vcm). A bias source (Vbias) is connected to said oscillator contact with a source contact. The voltage source includes a varying bias source which in use provides a bias varying in time. The bias source may for example be a switched DC source which in use provides an output signal varying between a first level and a second level.

16 Claims, 4 Drawing Sheets

OSCILLATOR CIRCUIT AND OSCILLATOR BIASING METHOD This application is the US national phase of international application PCT/NL02/00221 filed 5 Apr. 2002, which designated the US, the entire contents of each of which are incorporated herein by reference.

BACKGROUND

I. Field of the Invention

The invention relates to an oscillator circuit. The invention further relates to an oscillator biasing method.

II. Related Art and Other Considerations

Integrated oscillators are used as frequency references in all kind of integrated circuits, especially integrated synthesisers and integrated transceivers. The reduction in power consumption in these oscillators is of prime-importance in application with a limited power supply, such as a battery. Usually the design of an oscillator is based on phase-noise requirements, minimum amplitude or minimum required negative-resistance in order to sustain oscillation.

BRIEF SUMMARY

It is therefore a goal of the invention to provide an oscillator circuit with a low power consumption. In order achieve this goal, according to the invention an oscillator circuit, at least comprising: at least one oscillator device with a first oscillator contact and a second oscillator contact, and a bias voltage source having a first source contact connected to said first oscillator contact and a second source contact connected to said second oscillator contact, wherein said bias voltage source includes a varying voltage source which in use provides a bias voltage varying in time.

The oscillator circuit has a low power consumption, because the bias voltage source is a varying bias voltage source. The time averaged bias voltage of a varying bias voltage of a certain (maximum) amplitude is lower than the bias voltage of a DC bias source with the same amplitude. The current flowing through the circuit is proportional to the average bias voltage and hence the current consumption is lower. The lower current consumption causes a lower power consumption, since the consumed power is equivalent to the product of the current and the voltage.

The invention further provides an oscillator biasing method

BRIEF DESCRIPTION OF THE DRAWINGS

Further details, aspects and embodiments of the invention will be described with reference to the attached drawing.

DETAILED DESCRIPTION

Figure 1:
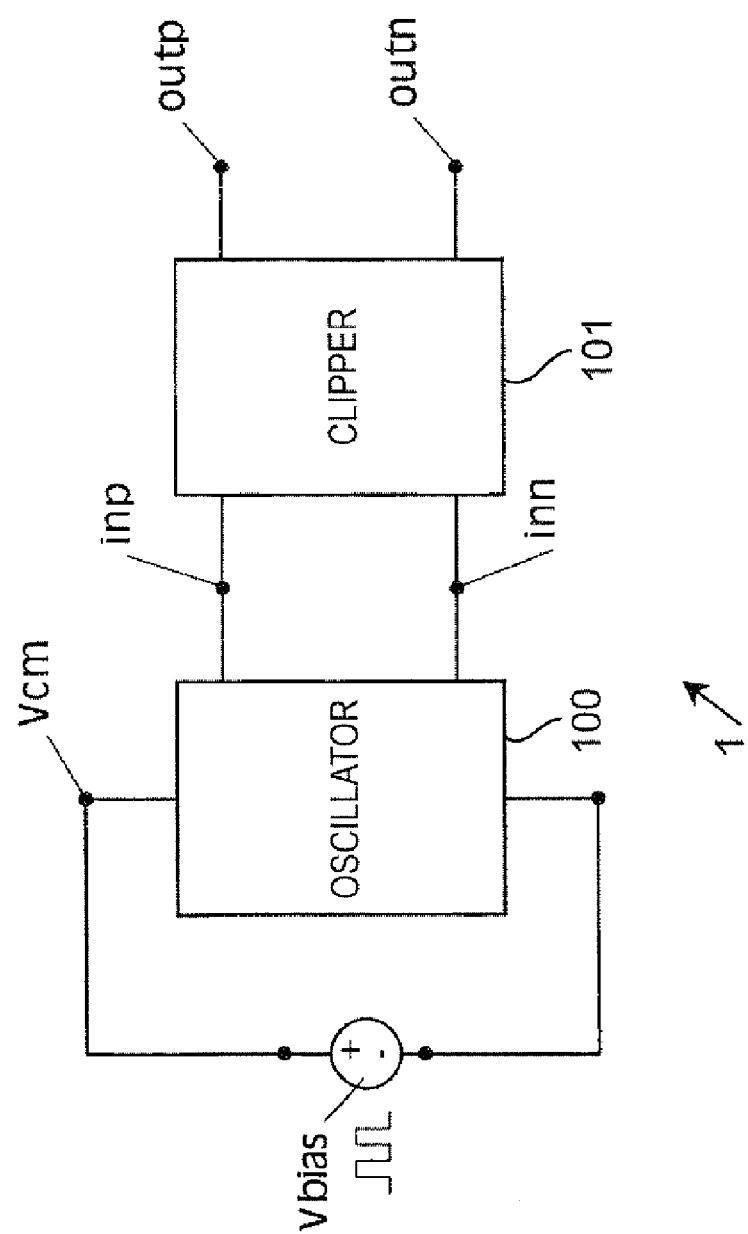
FIG. 1 shows a block diagram of a first example of an embodiment of an oscillator circuit according to the invention.

FIG. 1 shows a example of an embodiment of an oscillator circuit 1 according to the invention. The oscillator circuit 1 comprises an oscillator device 100, a limiter or clipper device 101 and a bias voltage source Vbias. The oscillator device 100 is connected to the limiter device 101 via a first oscillator contact inp and a second oscillator contact inn. The limiter may also be connected to the oscillator via a different number of contacts, such as a single contact or three or four contacts. The resonator 100 is connected to a bias voltage source Vbias via an oscillator bias input Vcm. The limiter device has a first limiter output contact outp and a second limiter output contact outn. The limiter may have a different number of output contacts, such as for example a single output contact or three or four output contacts. In the shown example, the outputs outp,outn of the limiter device 101 constitute outputs of the oscillator circuit 1.

In use, the oscillator 100 generates an oscillating signal, such as a sine-wave, a square wave or a saw-tooth wave. The oscillator 100 presents the oscillator signal at each of the oscillator contacts inp, inn. In the example, if is assumed that the signal at the first oscillator contact inp has a phase difference of substantially 180 degrees with respect to the signal at the second oscillator contact inn, i.e. they are substantially in antiphase. However, there may likewise be other phase differences or no phase difference between signals at the oscillator contacts.

The limiter device 101 acts as a signal shaper and may be replaced with another signal shaper device, such as for example a band-pass filter, a switch or otherwise.

The oscillator signal is received by the limiter device 101 which performs a limiting or clipping function. In general, the terms limiter and clipper are synonymous and are used interchangeable in this application without limitation to the functions and/or properties of the limiter or clipper device. The limiter automatically sets at least one boundary value upon the oscillator signal, i.e. if the amplitude of the oscillator signal exceeds the boundary signal, the signal is distorted. In the shown example, the limiter device 101 outputs a limiter output signal with an amplitude proportional to the oscillator signal as long as the oscillator signal has an amplitude below the boundary value and outputs a signal with a constant amplitude when the amplitude of the oscillator signal is above the boundary signal. Thus, if the input signal has an amplitude above the boundary value, the limiter output signal of the limiter device is clipped, i.e. the limiter output signal is constant and more or less independent from the input signal. If the amplitude of the oscillator signal is below the boundary value, the output signal of the limiter device is not clipped anymore and becomes substantially proportional to the oscillator signal.

The clipped signal is presented at the first limiter output outp and a 180 degrees phase shifted signal is presented at the second limiter output outn. However, other phase differences or no phase difference between signals at the limiter contacts are likewise possible. For example in quadrature applications with image rejection a 90 degrees phase difference may be appropriate.

The oscillator 100 is biased by a bias voltage from the bias voltage source Vbias. In the example of FIG. 1 the bias voltage source Vbias provides a square wave bias voltage. That is, the bias voltage has either a value $V_1$ or a value $V_2$. When the bias voltage is equal to V1, the bias voltage source is in a first state, and when the bias voltage is equal to V2, the source is in a second state. In the example of FIG. 1, V2 is equal to zero and V1 a positive value. Thus, in the first state the bias voltage is on and in the second state the bias voltage is off.

If the bias voltage source Vbias is turned on, i.e. the bias source is in the first state, the oscillator device 100 starts oscillating. After some time the bias voltage is switched off. The bias source Vbias is then in the second state. Due to the energy stored in the oscillator the oscillator will keep on oscillating. However, the amplitude of the oscillator will decrease in time because of the losses present in every real oscillator. Before the oscillator signal reaches an amplitude at which the limiter stops functioning properly, the bias voltage source is switched on again.

Because the bias voltage is turned off for some period of time, the power effectively used by the oscillator circuit is lowered compared to a DC bias voltage. Furthermore, the amplitude and shape of the output signal of the oscillator circuit do not change because of the limiter device 101. Instead of switching the bias voltage off, it is also possible to switch the bias voltage from a high state to a lower state, i.e. to set V2 to a non-zero value which is lower than V1. Thereby, the decrease of the oscillator signal amplitude will be slower.

Instead of the bias voltage source, a bias current source with a varying current source which in use provides a bias current varying in time may be used.

Figure 2:
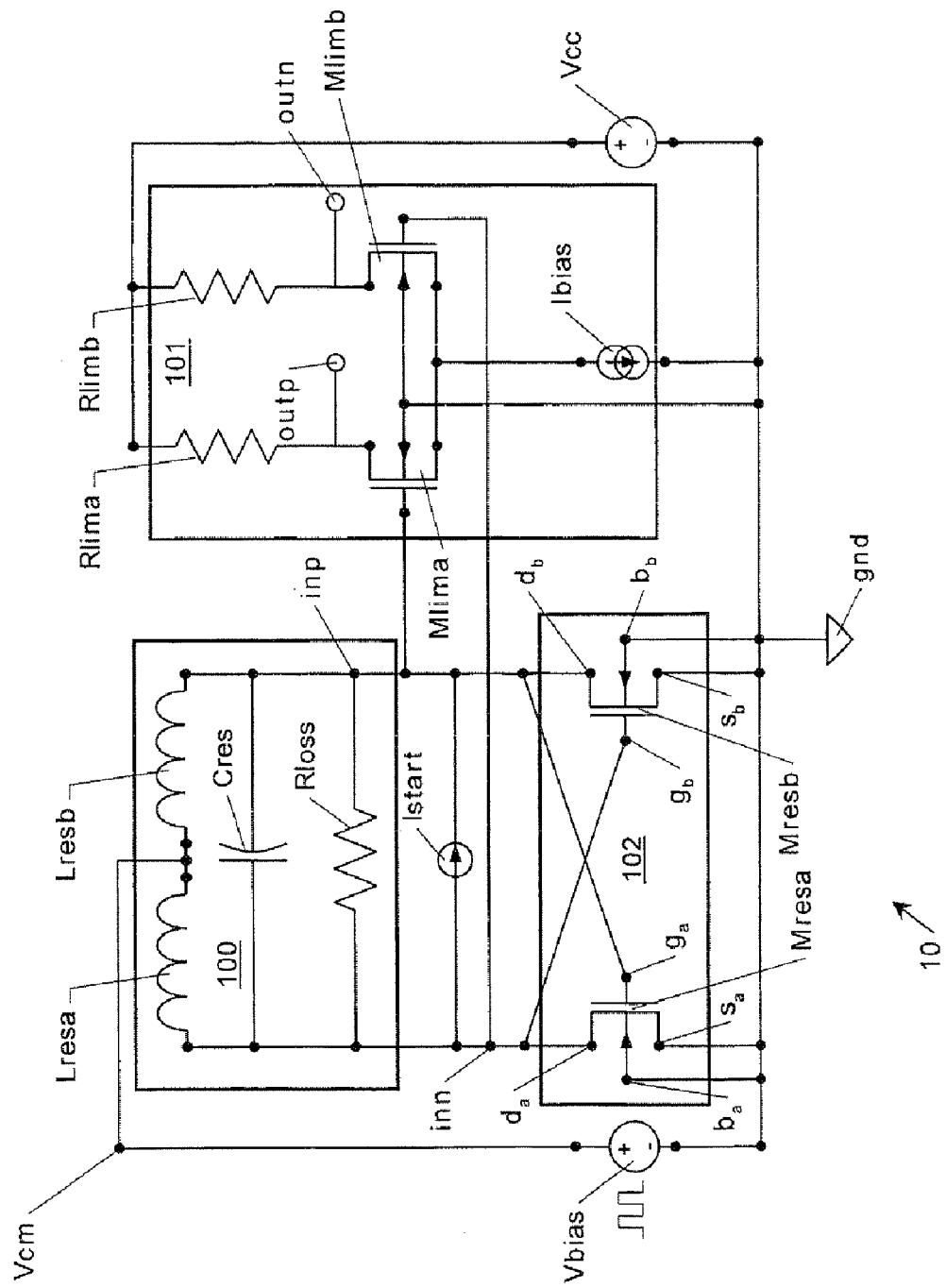
FIG. 2 shows a circuit diagram of a second example of an embodiment of an oscillator circuit according to the invention.

FIG. 2 shows an electrical circuit of a second and more detailed example of an oscillator circuit 10 according to the invention, The oscillator circuit 10 comprises an oscillator device 100 connected to a limiter device 101 via oscillator contacts inp,inn. The oscillator device 100 is further connected with the oscillator contacts inp,inn to a negative resistor or amplifier device 102. The oscillator device and the negative resistor 102 are also connected to a bias voltage source via a bias voltage contact Vcm and ground gnd. A pulse current source Istart is placed between the oscillator contacts to help the oscillator start oscillating in a simulator. In practice, noise present in the circuit may start the oscillator and the pulse current source may be omitted The oscillator device 100 comprises a first inductance Lresa and a second inductance Lresb connected in series. A capacitance Cres is connected in parallel to the inductances Lresa,Lresb. A resistor Rloss is connected in parallel to the capacitance Cres. The resistor Rloss represents losses in the oscillator, i.e. losses the inductors and/or the capacitor. In a physical implementation of the invention, the resistor may be omitted, since in reality the inductors and/or capacitors exhibit always some resistance.

The oscillator device 100 is a parallel LC-resonator, as is generally known in the art of oscillators. The LC-resonator has a mode of oscillating with a resonance frequency. The resonance frequency is also called the fundamental frequency of the oscillator. The resonance frequency is determined by the capacitance Cres and the inductances Lresa, Lresb, as is generally known in the art. The resonance frequency may mathematically be described by:

$$fres = \frac{1}{2\pi\sqrt{(Lresa + Lresb)Cres}} \qquad (1)$$

In equation (1) fres is the series resonance frequency and Lresa, Lresb and Cres are the reactances of the inductors Lrfesa, Lresb and the capacitor Cres respectively.

The oscillator 100 is biased by a bias voltage from the bias voltage source Vbias. The bias voltage source outputs a varying signal, in this example a square wave signal as is explained above with reference to the bias voltage source in FIG. 1. Thus the oscillator circuit 10 of FIG. 1 only consumes power if the voltage source Vbias is turned on. Hence, the power consumption of the oscillator circuit 10 is low.

Furthermore, the phase-noise of the oscillator circuit 10 is improved when the bias voltage source Vbias is switched off. As is known from C. A. M. Boon, "*Design of High-Performance Negative-Feedback Oscillators*", Ph.D. Thesis, Delft University of Technology, Delft, The Netherlands, 1989,the phase noise CNR of an oscillator may be described by the mathematical equation:

$$CNR = \frac{kTF}{P_{res}Q^2}\left(\frac{f_0}{\Delta f}\right)^2 \qquad (1)$$

where k denotes the Boltzman constant, T is the absolute temperature, F is the Noise Factor of the active part of the oscillator compared to the noise of the resonator, $P_{res}$ is the power dissipated in the resonator, Q is the resonator quality factor, $f_0$ is the oscillation frequency and f is the offset frequency at which the phase-noise is measured. In practice the Noise Factor F is in the order of 2 to 3 (6 to 10 dB) for properly designed oscillators. In the case that the bias voltage source is switched off, the noise of the active circuitry decreases because there is less active circuitry. As a consequence, the Noise Factor F in equation (1) decreases to 1 (0 dB). Thereby, the Carrier-to-Noise Ratio even increases if the power in the oscillator does not drop to more than a factor of 2 to 3, or a decrease in amplitude, which is equal to the square root of the power, of 2 1.4 or 3 1.7.

The negative resistor or amplifier device 102 compensates for losses in the oscillator 100, for example those represented by the resistor Rloss. The amplifier device 102 comprises a first transistor Mresa and a second transistor Mresb. In FIG. 2 the transistors are MOS (Metal Oxide Semiconductor) transistor devices. A drain $d_a$ of the first transistor Mresa is connected to the second oscillator contact inn. A drain $d_b$ of the second transistor Mresb is connected to the first oscillator contact inn. The sources $s_a,s_b$ and the back-gates $b_a,b_b$ of the transistors Mresa,Mresb are connected to ground. The gate $g_a,g_b$ of each of the MOS transistor device Mresa, Mresb are connected to the drain $d_a,d_b$ of the other MOS transistor device Mresa, Mresb, so the transistors are cross-connected.

Each of the transistors Mresa,Mresb outputs a current at its drain proportional to a voltage difference between its gate and its source. Thus, the output current of transistor Mresa is proportional to the voltage difference between the first oscillator contact inp and ground and the output current of the transistor Mresb is proportional to the voltage difference between the second oscillator contact inn and ground. For example, if the voltage at the first oscillator contact inp is low, the voltage at the second oscillator contact inn will be high in case of a 180 degrees phase shift. The second transistor Mresb will then inject a current towards ground, thus lowering the voltage at the first oscillator contact further thereby driving the oscillator. The first transistor Mresa operates in a similar manner with respect to the other contact.

Also connected to the first oscillator contact inp is a first limiter transistor Mlima, while a second limiter transistor Mlimb is connected with its gate to the second oscillator contact inn. The drain of each of the limiter transistors is connected to a limiter resistor Rlima resp. Rlimb. The source of the limiter transistors are connected to each other and to a bias current source Ibias. The limiter transistors, resistors and the bias current source form a differential amplifier stage 101. In use, the bias current of the bias current source Ibias is such that the amplifier is in overdrive if at the input a signal with amplitude equal to the minimal amplitude of the oscillator signal is presented. The minimal amplitude of the oscillator signal is the amplitude thereof, just before the bias voltage source is turned from the lower state to the second state. The differential amplifier thus acts as a limiter, i.e. the output signal is always clipped if the input signal of the differential amplifier exceeds the minimal amplitude. Instead of a differential amplifier any other limiter device may be used, such as a switch or a (bandpass) filter, to obtain a time-invariant amplitude of the oscillator circuit output signal.

Figure 4:
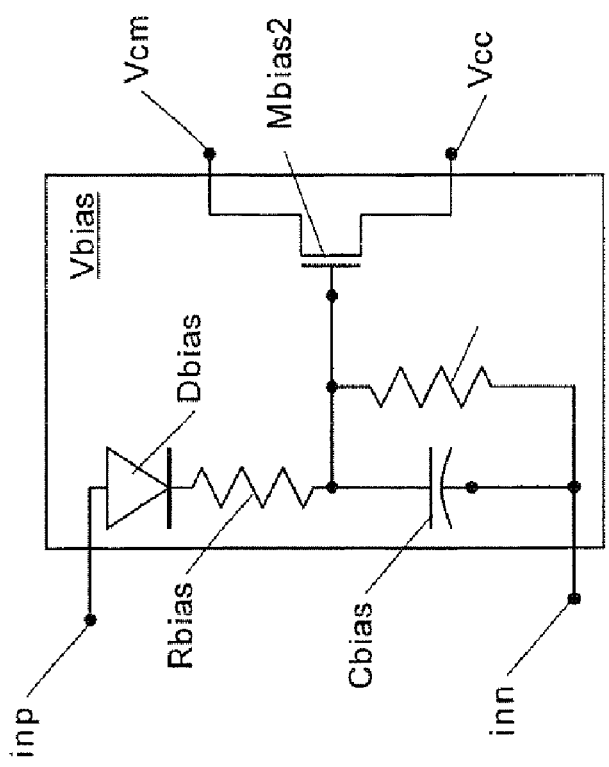
FIG. 4 shows a circuit diagram of a second example of a bias voltage source for in an oscillator circuit according to the invention.
Figure 3:
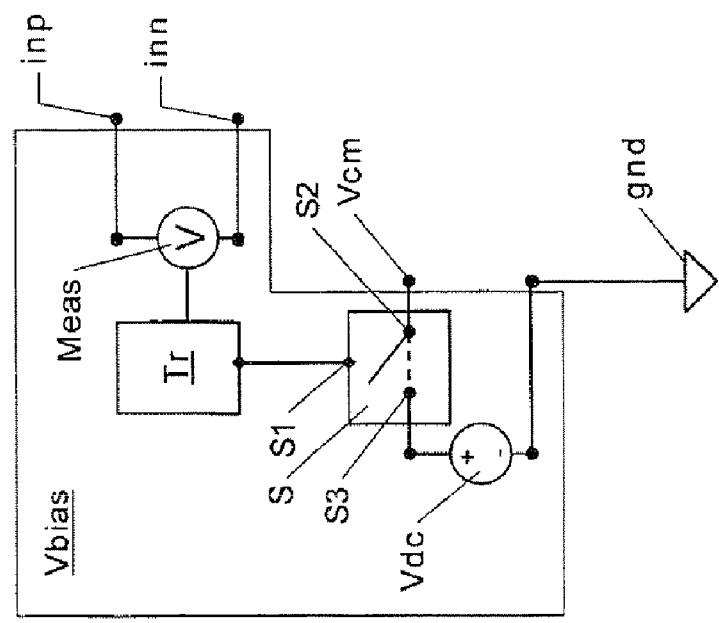
FIG. 3 shows a block diagram of a first example of a bias voltage source for in an oscillator circuit according to the invention.

The bias voltage source in FIGS. 1 and 2 outputs a square wave voltage signal. The generation of a square wave signal is generally known in the art and the bias voltage source may be of any type appropriate in the specific implementation. The bias voltage source may be an analogue or a digital device. Instead of a square wave, the bias voltage source may generate a different varying signal. FIG. 3 an FIG. 4 show examples of a bias voltage source which may be implemented in an oscillator circuit according to the invention.

The example of FIG. 3 comprises a voltmeter device Meas connected to oscillator contacts inp,inn. The meter Meas is connected to a threshold device Tr. The threshold device Tr is connected to a control input S1 of a switch device S. A first switch contact S3 is connected to a DC bias voltage source Vdc. The DC bias source Vdc is also connected to ground. A second switch contact S2 of the switch S is connected to the bias input contact Vcm.

In a conducting state, the switch contacts S2,S3 are electrically connected to each other and in a non-conducting state, the switch contacts S2,S3 are electrically disconnected. Thus, if the switch is in the conducting state, the voltage difference between the bias contact Vcm and ground is substantially equal to the bias voltage, while in the non-conducting state no bias voltage is applied to the bias contact. The state of the switch S is controlled by a signal outputted by the threshold device to the switch control input S1.

The meter Meas measures a voltage difference over the oscillator contacts and transmits the measured difference to the threshold device Tr. The threshold device Tr compares the measured voltage with a predetermined voltage threshold. If the measure voltage is above the threshold, the threshold device Tr outputs a signal representing a binary one, if the measure voltage is below the threshold, the threshold device outputs a signal representing a binary zero. Thereby, if the measure voltage is below the threshold, the switch is put in the conducting state and if the measure voltage is above the threshold the switch is put in the non-conducting state. The bias voltage is thus automatically turned on and switched off depending on the signal outputted by the oscillator device.

In the bias voltage source of FIG. 4, a bias resistor Rbias and a bias capacitor Cbias connected in series are placed between the first oscillator contact inp and the second oscillator contact inn. A discharge resistor Rdis is connected in parallel to the capacitor Cbias. The discharge resistor Rdis is connected to the node between the bias resistor and the bias capacitor and the second oscillator contact. A bias diode device Dbias is connected in series with the resistor Rbias. The bias diode device has a first diode contact connected to the first oscillator contact inp and a second diode contact connected to the resistor Rbias.

If the first diode contact is more than a diode voltage above the second diode contact the bias diode device Dbias is in a forward state. The bias diode device is in reverse, that is in a substantially non-conducting state if the voltage difference between the first diode contact is less than the diode voltage above the second diode contact or the voltage of the first diode contact is below the voltage of the second diode contact. The bias diode acts as a peak detector for measuring the amplitude of the oscillator signal, since the diode will be in forward if the voltage difference over diode contacts exceeds the diode voltage. Therefore, the diode only conducts above a certain amplitude of the voltage difference over the diode contacts, which is related to the signal applied at the first and second oscillator contact inp, inn.

The gate of a bias transistor Mbias2 is connected to the node between the bias capacitor Cbias and the bias resistor Rbias. The source of the transistor Mbias2 is connected to a power supply Vcc and the drain of the transistor Mbias2 is connected to the bias contact Vcm.

If a voltage is applied over the oscillator input contacts inp,inn, the bias capacitor Cbias will be charged, resulting in a voltage rise over the bias capacitor contacts, and thus resulting in a voltage rise at the bias resistor—bias capacitor node with respect to ground. The voltage at the bias resistor—bias capacitor node controls the state of the second bias transistor Mbias2. Thus, if the voltage at the node has reached a certain value the second bias transistor Mbias2 opens. If the second bias transistor Mbias2 is closed a voltage difference will exist between the source and drain of the second bias transistor Mbias2. Thereby the bias of the oscillator is turned off. Because the oscillator bias is turned off, the bias capacitor Cbias will not be charged anymore. The discharge resistor Rdis will slowly discharge the bias capacitor Cbias, thereby lowering the gate voltage of transistor Mbias2. After some time, the transistor Mbias2 will be switched on again, thus restarting the complete cycle.

The moment of opening and closing of the bias transistor may be adjusted using appropriate circuitry and will be apparent to a person skilled in the art of electronics.

The bias voltage source may also be implemented in a way different from the example shown in FIGS. 3 and 4. For example, the bias signal may be generated with a DC current source connected to one input of an edge triggered bistable device (also known as flipflop) and a clock signal supplied to both a the second input and the clock signal of the input. The bias signal may be generated in any other way, for example by counting the number of pulses from a clock. When the number of counted pulses is below a first predetermined value N, the output signal is high and if the number of counted pulses is above the first predetermined value N but below a second predetermined value M the output signal is low. The duty cycle is then equal to N/M, that is the ratio of the time the bias current has a high value (V₁) and the total signal period. Furthermore, the bias voltage may be of any non-DC signal type, such as a sine wave signal, saw tooth signal or any other type of signal.

Due to the lower amplitude driving the limiter after the bias voltage is switched off, the output signal of the limiter may have less steep rise- and fall-slopes. The oscillator circuit may be provided with a second limiter device to increase the steepness of the slopes. The second limiter device may for example be connected to the limiter output of the first limiter device, i.e. the limiters may be connected in series. In that case, for example one or more output contacts of the second limiter may be used as the output contacts of the oscillator device. Instead of the oscillator shown in FIG. 2, any other type of oscillator or resonator may be used in the oscillator circuit. The oscillator may for example compre electronic components forming an oscillator circuit, such as a series LCR oscillator or an inverted loop oscillator, or the oscillator may be a physical oscillator or resonator body, such as a tuning fork, a cavity resonator, a piezo-electric crystal, a rhumbatron or an acoustic oscillator, as are generally known in the art.

FIGS. 5–8 show graphs of a simulated performance of the oscillator circuit of FIG. 2. In the simulation, the values of the inductances Lresa,Lresb and the capacitance Cres are chosen such that the oscillator has a resonance frequency of 1 MHz. The bias voltage source is assumed to be a square-wave AC bias voltage source with a duty cycle of 28% and a period of 25 microseconds. The bias voltage is switched between 0 and 1V. The values of the components are listed in table 1. The transistors were simulated to be Metal Oxide Semiconductor (MOS) transistors with a width of 100 μm and a length of 0.35 μm.

TABLE 1

| Lresa  | Lresa  | Cres    | Rloss | Rlima | Rlimb | Vcc | Vbias              | Ibias  |
|--------|--------|---------|-------|-------|-------|-----|--------------------|--------|
| 800 nH | 800 nH | 15.8 nF | 1k    | 10k   | 10k   | 2 V | V1 = 1 V<br>V2 = 0 V | 100 A  |

Figure 7:
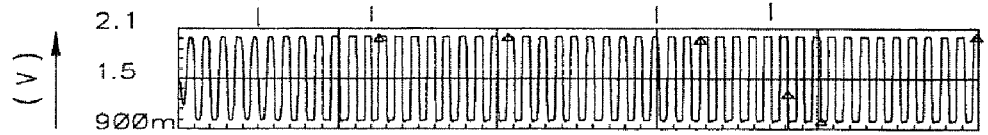
FIG. 7 shows a graph of the simulated temporal development of the voltage at node Vcm in the example of FIG. 2.
Figure 6:
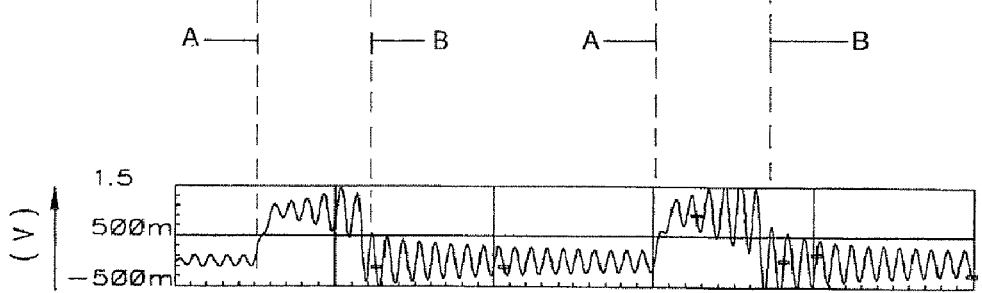
FIG. 6 shows a graph of the simulated temporal development of the voltage at node inp in the example of FIG. 2.
Figure 5:
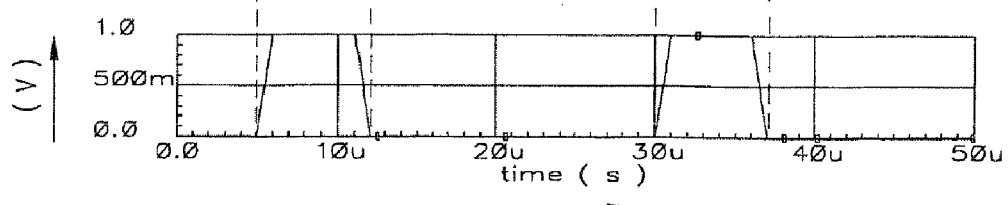
FIG. 5 shows a graph of the simulated temporal development of the voltage at node outp in the example of FIG. 2.

As is shown in FIG. 5, the bias voltage is turned on 5 microseconds after starting the measurement, as is indicated with dotted line A. Six microseconds later the bias voltage is turned off, as is indicated with dotted line B. At t=30 microseconds, the bias voltage is switched on again and at t=36 microseconds the bias voltage is turned off. At the moment the bias voltage is switched on for the first time, the oscillator is already oscillating, as is shown in FIG. 6. The oscillator continues oscillating but with a DC voltage added to the voltage difference between the oscillator contacts. The DC component disappears when the bias voltage is turned off. Note that the DC component does not affect the limiter device as the limiter has a high Common-Mode rejection. The output of the oscillator circuit, which is the signal presented at the limiter outputs outp,outn does not change in time and is independent of the bias voltage, as is shown in FIG. 7. It is a square-wave with a fixed amplitude, and has the frequency of the oscillator.

Figure 8:
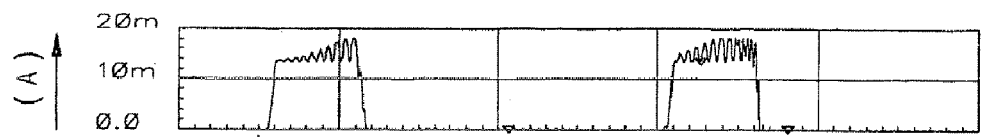
FIG. 8 shows a graph of the simulated temporal development of the current consumption of the example of FIG. 1.

In FIG. 8 the current consumption of the oscillator circuit 10 is shown, As can be seen, the circuit only consumes current (and hence consumes only power) when the bias voltage is turned on, i.e. between t=5 and 12 microseconds and t=30 and 37 microseconds. The current consumption is approx. 14 mA when the bias voltage is on. The average current consumption is approx. 2.4 mA in this example. This is approx. 6 times lower compared to the case when the oscillator would be ON continuously.

An oscillator circuit according to the invention is particularly suited for use in an integrated circuit because of its reduced power requirements. In general, integrated circuits are smaller, have a lower power consumption and improved performance characteristics compared to circuits comprising discrete components and are widely used in small portable devices fed by a power cell, which may be charged from time to time. Low power requirements result in increased standby and operational periods between charging moments. In battery operated applications, such as for example mobile phones, wireless device operating in accordance with the Bluetooth protocol, handheld computers and laptop computers, a long battery life time is of prime importance. Furthermore, if an oscillator circuit according to the invention is used is such an application the battery capacity or battery size may be reduced.

Such an integrated circuit may be manufactured in a CMOS process, which in general provides a small device with a low power consumption.

An oscillator circuit according to the invention is also especially suited for implementation in wireless device with limited power supply and/or which size should be as small as possible, such as mobile telephones or devices communicating via the so called Bluetooth protocol. It should be noted that the oscillator circuit may also be implemented with at least one discrete component.

Furthermore, an oscillator circuit according to the invention may be implemented in a receiver device or a transceiver (transmitter and receiver) device. A receiver device is an electronic device for the reception and processing of electromagnetic signals such as radio signals. A transceiver device is a receiver device which is able to transmit electromagnetic signals as well.

A receiver device or a transceiver device with an oscillator circuit according to the invention may be used in any wireless electronic device. A wireless electronic device is any device used for the reception of electro-magnetic signals. A wireless electronic device may comprise a transmitter functionality for the transmission of electro-magnetic signals. The wireless electronic device may for example be a device with a limited power supply (such as a battery), such as mobile telephone, a portable radio or a lap-top computer connected to a other device via a Bluetooth connection. The wireless electronic device may, however, also be a device with a virtually unlimited power supply, like a mobile telephone base station or a desktop computer communicating to other device via a Bluetooth connection.

The invention claimed is:
1. An oscillator circuit, at least comprising:
   at least one oscillator device having at least one oscillator bias contact;
   a signal shaper device arranged for outputting a limited output signal with a constant amplitude when amplitude of a signal provided by the oscillator device is above a boundary value;

a bias source having a source contact connected to said oscillator bias contact;

said bias source having a first state in which a high level of energy is provided at said source contact, and a second state in which a lower level of energy is provided at said source contact, wherein the high level of energy at said source contact will keep the oscillator device in an oscillating state, whereas the lower level of energy will result in a decreasing amplitude of the signal provided by the oscillator device; and said circuit further including:

at least one switch for switching the bias source from the first state to the second state when a predetermined criterion is satisfied and from the second state back to the first state before the decreasing amplitude of the signal provided by the oscillator device decreases below the boundary value.

2. An oscillator circuit as claimed in claim 1 wherein said bias source is a switched DC source which in use provides a bias signal varying between a first level and a second level.

3. An oscillator circuit as claimed in claim 1, wherein the lower level of energy is substantially zero.

4. An oscillator circuit as claimed in claim 1, wherein said signal shaper device comprises at least one limiter device, said limiter device outputting an output signal with an amplitude proportional to said amplitude of the signal provided by the oscillator device when said amplitude of the signal provided by the oscillator device is below said boundary value.

5. An oscillator circuit as claimed in claim 1, wherein said signal shaper device comprises a band-pass filter device.

6. An oscillator circuit as claimed in claim 1, further comprising:

a bias control circuit for switching the bias source on and off depending on a signal outputted by the oscillator device.

7. An oscillator circuit as claimed in claim 1, wherein said oscillator device at least comprises at least one electrical device with a positive feedback loop.

8. An oscillator circuit as claimed in claim 1, wherein said oscillator device at least comprises at least one resonator body.

9. An oscillator circuit as claimed in claim 1, further comprising a negative resistance device comprising at least one transistor device.

10. An oscillator circuit as claimed in claim 4, wherein said limiter device comprises at least one differential amplifier with at least one input contact connected to at least one oscillator output contact, and at least one output contact connected to a load.

11. An oscillator circuit as claimed in claim 10, wherein said load comprises:

at least one resistor connecting at least one of said at least one output contacts to a power supply.

12. An oscillator circuit as claimed in claim 4, wherein said limiter at least comprises at least one transistor device.

13. An oscillator circuit as claimed in claim 1, wherein said bias source comprises a bias voltage source.

14. An oscillator circuit as claimed in claim 1, wherein said bias source comprises a bias current source.

15. A wireless electronic device including an oscillator circuit as claimed in claim 1.

16. A method for reducing the power consumption of an oscillator circuit, said oscillator circuit including an oscillator device and a bias source, said method including:

outputting a limited output signal with a constant amplitude when the amplitude of the signal provided by the oscillator device is above a boundary value;

switching when a predetermined criterion is satisfied said bias source from a first state in which a high level of energy is provided to the oscillator circuit to a second state in which a lower level of energy is provided to the oscillator circuit, wherein the high level of energy at said source contact will keep the oscillator device in an oscillating state, whereas the lower level of energy will result in a decreasing amplitude of the signal provided by the oscillator device; and switching the bias source from the second state back to the first state before the decreasing amplitude of the signal provided by the oscillator device decreases below the boundary value.

* * * * *